United States Patent [19]
Keeth

[11] Patent Number: 5,838,177
[45] Date of Patent: Nov. 17, 1998

[54] ADJUSTABLE OUTPUT DRIVER CIRCUIT HAVING PARALLEL PULL-UP AND PULL-DOWN ELEMENTS

[75] Inventor: Brent Keeth, Boise, Id.

[73] Assignee: Micron Technology, Inc., Boise, Id.

[21] Appl. No.: 779,344

[22] Filed: Jan. 6, 1997

[51] Int. Cl.[6] .................................................. H03K 3/00
[52] U.S. Cl. .......................... 327/108; 327/112; 327/333; 327/437; 326/87
[58] Field of Search ............................ 327/108–112, 170, 327/333, 427, 434, 436, 437; 326/82, 83, 86, 87, 88

[56] References Cited

U.S. PATENT DOCUMENTS

| | | | |
|---|---|---|---|
| 4,096,402 | 6/1978 | Schroeder et al. ........................ | 327/77 |
| 4,404,474 | 9/1983 | Dingwall ................................ | 327/170 |
| 4,638,187 | 1/1987 | Boler et al. ............................. | 326/27 |
| 4,789,796 | 12/1988 | Foss ........................................ | 326/87 |
| 4,829,199 | 5/1989 | Prater ...................................... | 326/27 |
| 4,888,498 | 12/1989 | Kadakia ................................. | 327/546 |
| 4,958,088 | 9/1990 | Farah-Bakhsh et al. ................ | 326/24 |
| 4,984,204 | 1/1991 | Sato et al. .......................... | 365/189.11 |
| 5,122,690 | 6/1992 | Bianchi .................................. | 326/87 |
| 5,128,560 | 7/1992 | Chern ..................................... | 326/81 |
| 5,128,563 | 7/1992 | Hush et al. ............................. | 326/87 |
| 5,134,311 | 7/1992 | Biber et al. ............................ | 327/108 |
| 5,150,186 | 9/1992 | Pinney et al. .......................... | 326/87 |
| 5,165,046 | 11/1992 | Hesson .................................. | 327/111 |
| 5,179,298 | 1/1993 | Hirano et al. .......................... | 326/83 |
| 5,194,765 | 3/1993 | Dunlop et al. ......................... | 327/112 |
| 5,220,208 | 6/1993 | Schenck ................................. | 326/27 |
| 5,239,206 | 8/1993 | Yanai ..................................... | 327/202 |
| 5,243,703 | 9/1993 | Farmwald et al. ..................... | 395/325 |
| 5,254,883 | 10/1993 | Horowitz et al. ...................... | 326/30 |
| 5,274,276 | 12/1993 | Casper et al. .......................... | 326/21 |
| 5,276,642 | 1/1994 | Lee .................................... | 365/189.04 |

(List continued on next page.)

FOREIGN PATENT DOCUMENTS

| | | |
|---|---|---|
| 0382124A2 | 8/1990 | European Pat. Off. . |
| 0382124A3 | 8/1990 | European Pat. Off. . |
| 0450871 | 10/1991 | European Pat. Off. . |
| 0599631 | 6/1994 | European Pat. Off. . |
| 0655741 | 5/1995 | European Pat. Off. . |
| 0680049 | 11/1995 | European Pat. Off. . |
| 2-112317 | 4/1990 | Japan ..................................... 327/170 |
| 4-135311 | 5/1992 | Japan ..................................... 327/261 |
| 5-136664 | 6/1993 | Japan ..................................... 327/261 |
| 05282868 | 10/1993 | Japan . |
| 06326590 | 11/1994 | Japan . |
| 96/10866 | 4/1996 | WIPO . |

OTHER PUBLICATIONS

Chapman, et al., "A Low–Cost High–Performance CMOS Timing Vernier For ATE", *IEEE International Test Conference*, 459–468, (1995).

Lijuslin, et al., "An Integrated 16–channel CMOS Time to Digital Converter", *Nuclear Science Symposium & Medical Imaging Conference vol. 1*, IEEE Conference Record, 625–629, (1993).

Taguchi, et al., "A 40–ns 64–Mb DRAM with 64–b Parallel Data Bus Architecture", *IEEE J. Solid–State Circuits, 26*, 1493–1497, (Nov. 1991).

*Primary Examiner*—Kenneth B. Wells
*Attorney, Agent, or Firm*—Schwegman, Lundberg, Woessner & Kluth, P.A.

[57] ABSTRACT

An output driver circuit offers control and logic level adjustment for high speed data communications in a synchronous memory such as a synchronous dynamic random access memory (SDRAM). Level adjustment is obtained by resistive division between a termination resistor and controllable impedances between an output node and VDD and VSS power supplies. Control functions include slew rate modification of the signal at the output node, by sequentially turning on or off output transistors in response to a transition in an input signal. Different schemes of weighting the output transistors obtains different characteristics of the output signal. Load matching circuitry and voltage level forcing circuitry is described for improving high frequency operation.

15 Claims, 14 Drawing Sheets

U.S. PATENT DOCUMENTS

| | | | |
|---|---|---|---|
| 5,278,460 | 1/1994 | Casper | 327/546 |
| 5,281,865 | 1/1994 | Yamashita et al. | 327/208 |
| 5,311,481 | 5/1994 | Casper et al. | 365/230.06 |
| 5,321,368 | 6/1994 | Hoelzle | 327/218 |
| 5,347,177 | 9/1994 | Lipp | 326/30 |
| 5,347,179 | 9/1994 | Casper et al. | 326/26 |
| 5,355,391 | 10/1994 | Horowitz et al. | 375/36 |
| 5,361,002 | 11/1994 | Casper | 327/530 |
| 5,400,283 | 3/1995 | Raad | 365/203 |
| 5,432,823 | 7/1995 | Gasbarro et al. | 375/356 |
| 5,438,545 | 8/1995 | Sim | 325/83 |
| 5,440,260 | 8/1995 | Hayashi et al. | 327/278 |
| 5,451,898 | 9/1995 | Johnson | 327/53 |
| 5,457,407 | 10/1995 | Shu et al. | 326/30 |
| 5,473,575 | 12/1995 | Farmwald et al. | 365/230.06 |
| 5,485,490 | 1/1996 | Leung et al. | 375/371 |
| 5,488,321 | 1/1996 | Johnson | 327/66 |
| 5,497,127 | 3/1996 | Sauer | 331/17 |
| 5,498,990 | 3/1996 | Leung et al. | 327/323 |
| 5,506,814 | 4/1996 | Hush et al. | 365/230.03 |
| 5,508,638 | 4/1996 | Cowles et al. | 326/38 |
| 5,513,327 | 4/1996 | Farnwald et al. | 395/309 |
| 5,568,077 | 10/1996 | Sato et al. | 327/199 |
| 5,574,698 | 11/1996 | Raad | 365/230.06 |
| 5,576,645 | 11/1996 | Farwell | 327/94 |
| 5,578,941 | 11/1996 | Sher et al. | 326/34 |
| 5,581,197 | 12/1996 | Motley et al. | 326/30 |
| 5,589,788 | 12/1996 | Goto | 327/276 |
| 5,590,073 | 12/1996 | Arakawa et al. | 365/185.08 |
| 5,619,473 | 4/1997 | Hotta | 365/238.5 |
| 5,621,340 | 4/1997 | Lee et al. | 327/65 |
| 5,621,690 | 4/1997 | Jungroth et al. | 365/200 |
| 5,627,780 | 5/1997 | Malhi | 365/185.09 |
| 5,627,791 | 5/1997 | Wright et al. | 365/222 |
| 5,631,872 | 5/1997 | Naritake et al. | 365/227 |
| 5,636,163 | 6/1997 | Furutani et al. | 365/189.01 |
| 5,636,173 | 6/1997 | Schaefer | 365/230.03 |
| 5,636,174 | 6/1997 | Rao | 365/230.03 |
| 5,638,335 | 6/1997 | Akiyama et al. | 365/230.03 |
| 5,668,763 | 9/1997 | Fujioka et al. | 365/200 |
| 5,694,065 | 12/1997 | Hamasaki et al. | 327/108 |

5,838,177

ADJUSTABLE OUTPUT DRIVER CIRCUIT HAVING PARALLEL PULL-UP AND PULL-DOWN ELEMENTS

TECHNICAL FIELD OF THE INVENTION

This invention relates generally to integrated circuits and particularly to data output drivers for high speed data transmission.

BACKGROUND OF THE INVENTION

Integrated circuits typically include a number of input/output pins which are used for communication with additional circuitry. For example, an integrated memory device such as a dynamic random access memory (DRAM) includes both control inputs for receiving memory operation control signals, and data pins for bidirectional data communication with an external system or processor.

The data transmission rate of modern integrated circuits is primarily limited by internal circuitry operating speeds. Communication networks can typically transmit signals between circuitry at a rate that is faster than the capacity of some integrated circuits. To address the need for faster circuits, a group of integrated circuits can be combined on a common bus. In this configuration, each integrated circuit operates in a coordinated manner with the other integrated circuits to share data that is transmitted at a high speed. For example, a group of memory devices, such as DRAMs, static RAMs, or read only memories (ROM), can be connected to a common data bus. The data rate of the bus may be substantially faster than the feasible operating speed of the individual memories. Each memory, therefore, is operated so that while one memory processes received data, another memory receives new data. By providing an appropriate number of memory devices and an efficient control system, very high speed data transmissions can be achieved.

As the transmission rate of the data communication signals continues to increase, new circuitry and methods are needed to accurately transmit data from each integrated circuit. One proposed solution is a bus driver described in U.S. Pat. No. 5,254,883. This bus driver circuit uses parallel output transistors that single-endedly couple the bus to a power supply. The output transistors are fabricated in different sizes and selectively activated to control the bus current. This approach is directed towards accurate bus current control to establish the bus voltage at an accurate logic voltage level. However, the approach lacks control over the transition of the bus voltage between logic voltage levels.

For the reasons stated above, and for other reasons stated below which will become apparent to those skilled in the art upon reading and understanding the present specification, there is a need in the art for a high speed output driver circuit which is fully adjustable, and offers control of the transition of the bus voltage between logic voltage levels.

SUMMARY OF THE INVENTION

The above mentioned problems with output driver circuits and other problems are addressed by the present invention and will be understood by reading and studying the following specification.

The present invention describes an output driver circuit comprising output transistors having a control terminal, and electrically coupling an output node to a first voltage, and a control circuit coupled to the control terminal of the output transistors. The control circuit sequentially turns on or off the output transistors in response to a transition of an input signal received by the control circuit. The control circuit also comprises forcing circuitry for selectively forcing a signal on an internal control circuit node to the first or a second voltage.

In another embodiment, a synchronous memory device is described. The memory device comprises an array of memory cells for storing data received on a data communication line, and an output driver circuit having an output node electrically coupled to the data communication line. The output driver provides data read from the array of memory cells. The output driver circuit comprises first output transistors for electrically coupling a first voltage to an output node, second output transistors for electrically coupling the output node to a second voltage, and a control circuit. The control circuit is coupled to a control terminal of each of the first and second output transistors for sequentially turning on or off the output transistors in response to respective transitions in first and second input signals received by the control circuit. The memory further comprises matching circuitry for matching an output load at the control terminal of each output transistor.

The present invention is particularly useful for high speed data communications, such as in a synchronous memory including a dynamic random access memory (DRAM).

BRIEF DESCRIPTION OF THE DRAWINGS

In the drawings, like numerals describe substantially similar components throughout the several views.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

The present invention is applicable to integrated circuit devices. In particular, the present invention can be embodied as an integrated circuit memory device. These memory devices include, but are not limited to, synchronous memories, dynamic random access memories (DRAM, or SDRAM), and static memories (SRAM).

Figure 1:
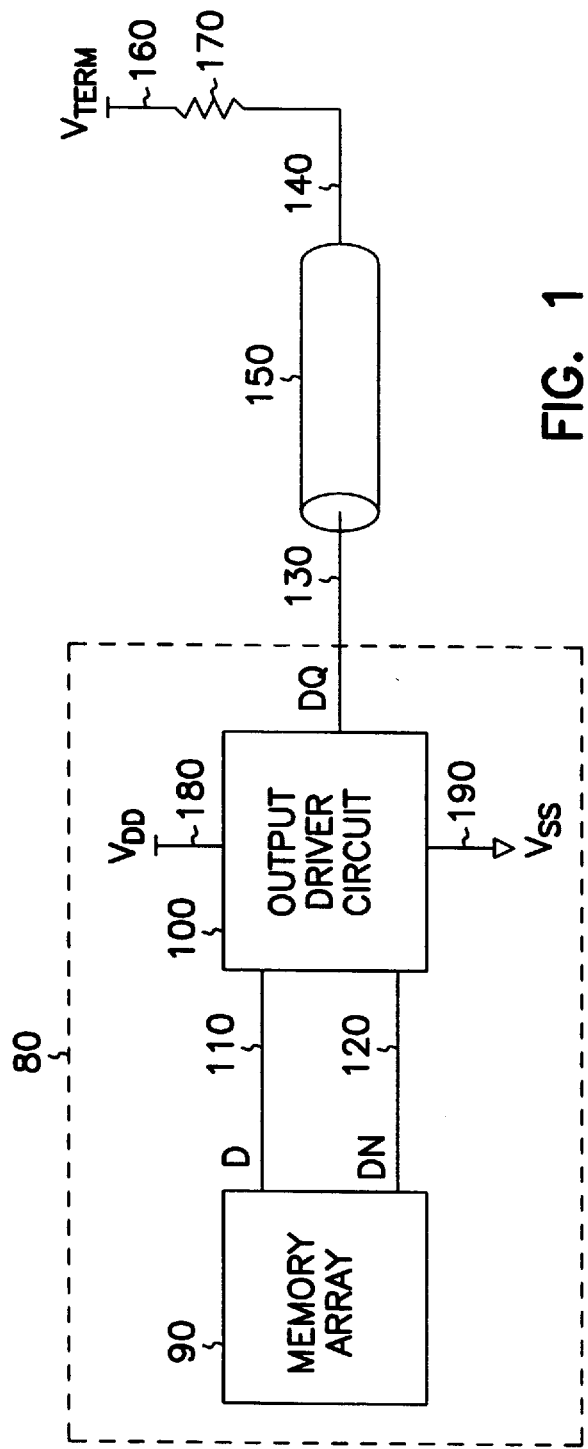
FIG. 1 is a schematic illustration of one embodiment of the present invention.

FIG. 1 illustrates one embodiment of the present invention and the environment in which it is used. In FIG. 1, a memory device 80 is illustrated which includes a memory array 90. It will be understood by those skilled in the art that memory 80 has been simplified to focus on the feature particularly relevant to understanding the present invention. Necessary control and communication circuitry for the memory, therefore, have not been shown, but are known to those skilled in the art. Memory array 90 includes memory cells and read circuitry for reading data stored in the memory cells. Output driver circuit 100 receives the data read from memory array 90 as first input signal D at node 110 and its binary complement, second input signal DN, at node 120, and provides in response thereto an output signal DQ at output node 130. Output node 130 is electrically coupled to receiving node 140 through data communication line 150, which may include distributed interconnect, pad, and other resistance and capacitance both on and off the integrated circuit chip. Output node 130 is also electrically coupled to a termination power supply voltage, $V_{term}$, at termination node 160 through termination resistor 170. First and second power supply voltages, such as $V_{DD}$ at node 180 and $V_{SS}$ at node 190 are provided to output driver circuit 100. $V_{term}$ is typically a voltage approximately midway between $V_{DD}$ and $V_{SS}$.

Figure 2:
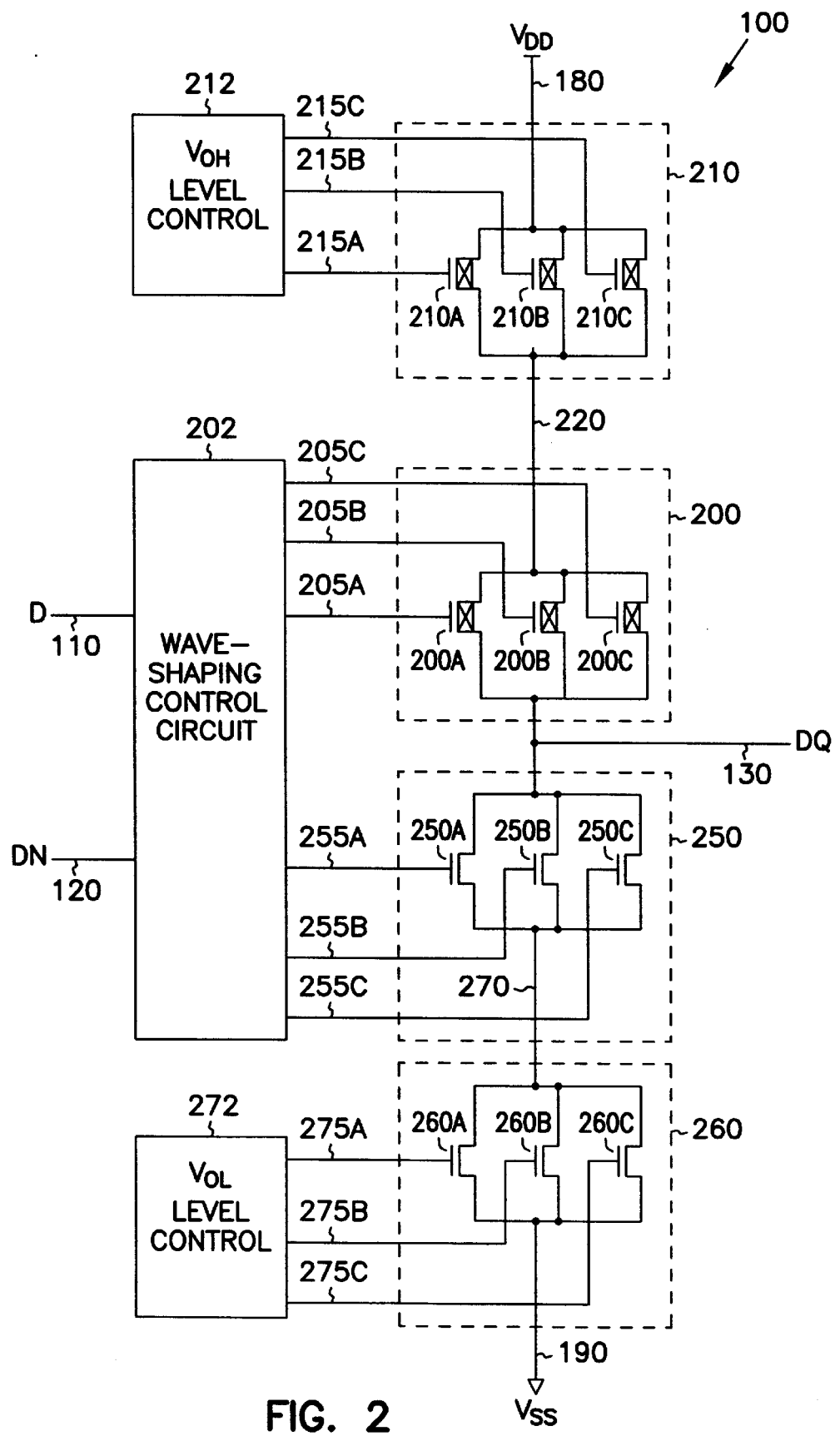
FIG. 2 is a more detailed schematic of one embodiment of the output driver circuit of FIG. 1.

FIG. 2 is a schematic illustration that illustrates one embodiment of the output driver circuit 100 in more detail. In FIG. 2, a first plurality 200 of output transistors, such as P-type transistors 200A–C, have their drain terminals coupled together and to output node 130. Wave-shaping control circuit 202 provides independent control terminal signals at nodes 205A–C to the respective gate terminals of P-type transistors 200A–C. The source terminals of P-type transistors 200A–C are coupled together and to $V_{DD}$ through a first impedance 210.

In one embodiment, first impedance 210 comprises active devices such as P-type transistors 210A–C, having their drain terminals coupled together and to the source terminals at node 220 of each of P-type transistors 200A–C in the first plurality 200 of output transistors. P-type transistors 210A–C have their source terminals coupled together and to $V_{DD}$ at node 180. $V_{OH}$ level control circuit 212 provides independent control terminal signals at nodes 215A–C to the respective gate terminals of P-type transistors 210A–C to programmably control first impedance 210 by varying how many and which of P-type transistors 210A–C are turned on. Those of P-type transistors 210A–C that are turned on contribute to the effective value of the impedance between node 220 and $V_{DD}$ at node 180. P-type transistors 210A–C may have varying width/length aspect ratios, or may each comprise different multiples of instances of parallel-connected P-type transistors of the same width/length aspect ratio, or may otherwise be designed for optimizing the effective value of the impedance between node 220 and $V_{DD}$ at node 180 by permuting which of P-type transistors 210A–C are turned on.

Impedance 210 forms a resistive divider with termination resistor 170, the impedance values of which determine the binary high logic voltage level, $V_{OH}$, at output node 130. $V_{OH}$ level control circuit 212, by controlling which of P-type transistors 210A–C are turned on, controls the value of impedance 210 and, in turn, controls the value of $V_{OH}$.

A second plurality 250 of output transistors, such as N-type transistors 250A–C, have their drain terminals coupled together and to output node 130. Wave-shaping control circuit 202 provides independent control terminal signals at nodes 255A–C to the respective gate terminals of N-type transistors 250A–C. The source terminals of N-type transistors 250A–C are coupled together and to $V_{SS}$ through a second impedance 260.

In one embodiment, second impedance 260 comprises active devices such as N-type transistors 260A–C, having their drain terminals coupled together and to the source terminals at node 270 of each of N-type transistors 250A–C in the second plurality 250 of output transistors. N-type transistors 260A–C have their source terminals coupled together and to $V_{SS}$ at node 190. $V_{OL}$ level control circuit 272 provides independent control terminal signals at nodes 275A–C to the respective gate terminals of N-type transistors 260A–C to programmably control impedance 260 by varying how many and which of N-type transistors 260A–C are turned on. Those of N-type transistors 260A–C that are turned on contribute to the effective impedance between node 270 and $V_{SS}$ at node 190. N-type transistors 260A–C may have varying width/length aspect ratios, or may each comprise different multiples of instances of parallel-connected N-type transistors of the same width/length aspect ratio, or may otherwise be designed for optimizing the effective impedance between node 270 and $V_{SS}$ at node 190 by permuting which of N-type transistors 260A–C are turned on.

Impedance 260 forms a resistive divider with termination resistor 170, the impedance values of which determine the binary low logic voltage level, $V_{OH}$, at output node 130. $V_{OL}$ level control circuit 272, by controlling which of N-type transistors 260A–C are turned on, controls the value of impedance 260 and, in turn, controls the value of $V_{OL}$.

In the above description first plurality 200 of output transistors, second plurality 250 of output transistors, first impedance 210, and second impedance 260 have each been described, for clarity of illustration, as comprising three field-effect transistors. However, it is understood that the exact number of said transistors may be selected according to individual design constraints without departing from the scope and spirit of the present invention.

Figure 3:
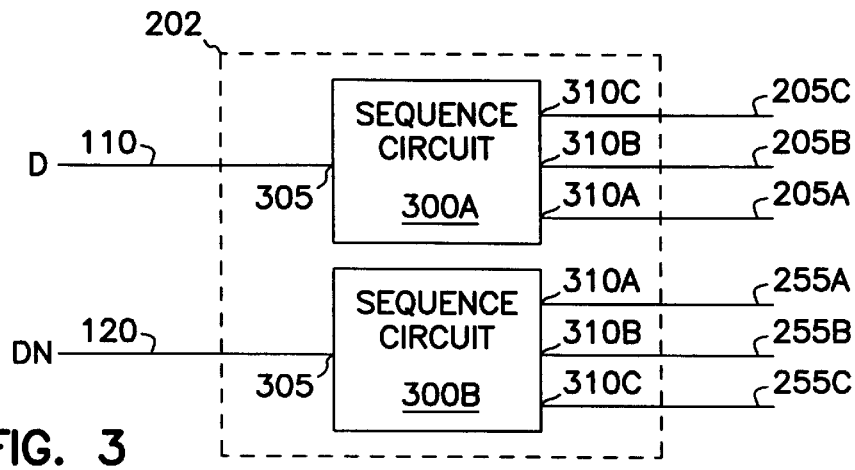
FIG. 3 is a schematic of wave-shaping control circuitry of FIG. 2 in more detail.

FIG. 3 is a schematic illustration that illustrates wave-shaping control circuit 202 in more detail. Wave-shaping circuit 202 includes sequence circuits 300A–B receiving at respective first and second input signals D and DN at input terminals 305 that are electrically coupled to respective nodes 110 and 120. Sequence circuits 300A–B respectively provide, in response thereto, sequentially time-delayed control terminal signals at output terminals 310A–C that are electrically coupled to respective nodes 205A–C and 255A–C. The sequentially time-delayed control terminal signals effect coupling of output node 130 to respective $V_{DD}$ at node 180 and $V_{SS}$ at node 190 through respective first plurality 200 and second plurality 250 of output transistors. As will be described below, by providing sequentially delayed control terminal signals to the output transistors, sequence circuits 300A–B provide control over the slew rate of the voltage at output node 130, with the slew rate control being substantially independent of the $V_{OH}$ and $V_{OL}$ level control provided by first and second impedances 210 and 260, respectively.

Figure 4:
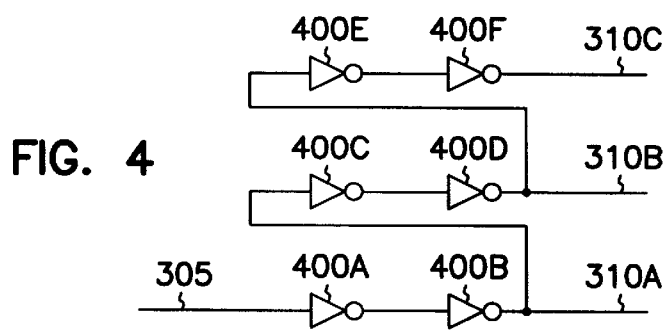
FIG. 4 is a schematic of one embodiment of sequence circuits of FIG. 3.

FIG. 4 is a schematic illustration that illustrates one embodiment of each of sequence circuits 300A–B in more detail. FIG. 4 includes a string of series-cascaded inverters 400A–F, for receiving an input signal at input terminal 305, and providing a number of sequentially delayed signals in response thereto at output terminals 310A–C. In this embodiment, the delay between the signal transition at the input terminal 305 and the signal transition at each of the output terminals 310A–C is determined by the inverter delays of the corresponding number of inverters therebetween, including interconnect capacitance and load capacitance of subsequent inverters and output transistors.

Figure 5:
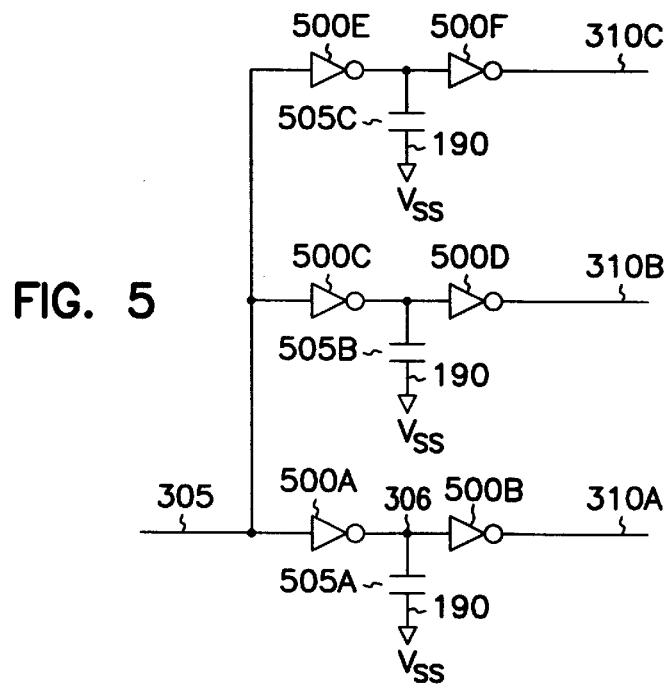
FIG. 5 is a schematic of another embodiment of sequence circuits of FIG. 3.

FIG. 5 is a schematic illustration that illustrates another embodiment of each of sequence circuits 300A–B in more detail. FIG. 5 includes pairs of series-cascaded inverters 500A–F. Each pair of inverters, such as pairs 500A–B, 500C–D, 500E–F, receives the input signal at input terminal 305 and provide a sequentially delayed signal in response thereto at respective output terminals 310A–C. Each pair of inverters, such as pairs 500A–B, 500C–D, 500E–F, has a capacitance interposed therebetween, such as respective capacitances 505A–C. The capacitances 505A–C are preferably trimmably adjustable, such as by fuse or other programmable elements, for tailoring the delays between the signal transition at the input terminal 305 and the signal transition at each of the output terminals 310A–C. The capacitances are trimmed so that each delay path is different to provide a number of sequentially delayed signals at output terminals 310A–C.

Figure 6:
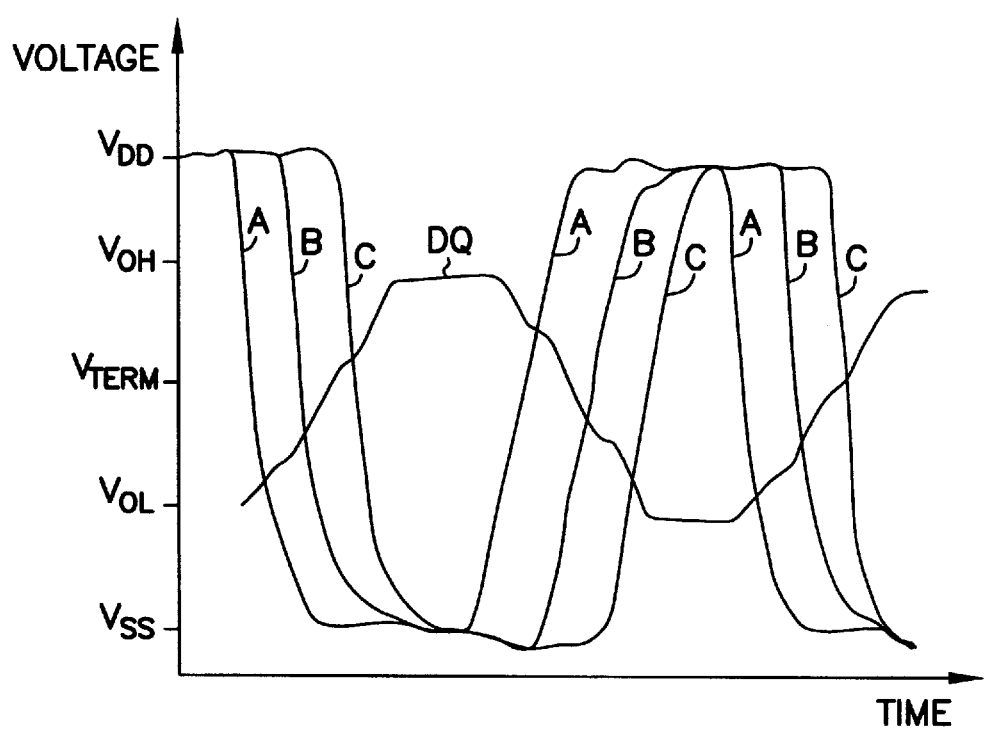
FIG. 6 is a graph illustrating the voltage vs. time waveforms of the output driver circuit of FIG. 2.

FIG. 6 is a graph illustrating the voltage vs. time waveforms of the output driver circuit 100. In FIG. 6, signal A represents the voltage waveform at nodes 205A and 255A, signal B represents the voltage waveform at nodes 205B and 255B, and signal C represents the voltage waveform at nodes 205C and 255C, and signal DQ represents the voltage waveform at node 130. Thus, FIG. 6 illustrates the slew-rate tailoring of transitions in the DQ signal in response to the sequentially delayed control terminal signals provided by wave-shaping control circuit 202. FIG. 6 also illustrates the reduced signal swing, i.e. $V_{OH}$ and $V_{OL}$ voltage levels, provided by impedances 210 and 260 in conjunction with terminating resistor 170. Providing an odd number of output transistors in each of the first plurality 200 and second plurality 250 of output transistors, avoids a plateau in signal DQ at the $V_{term}$ voltage.

Figure 7:
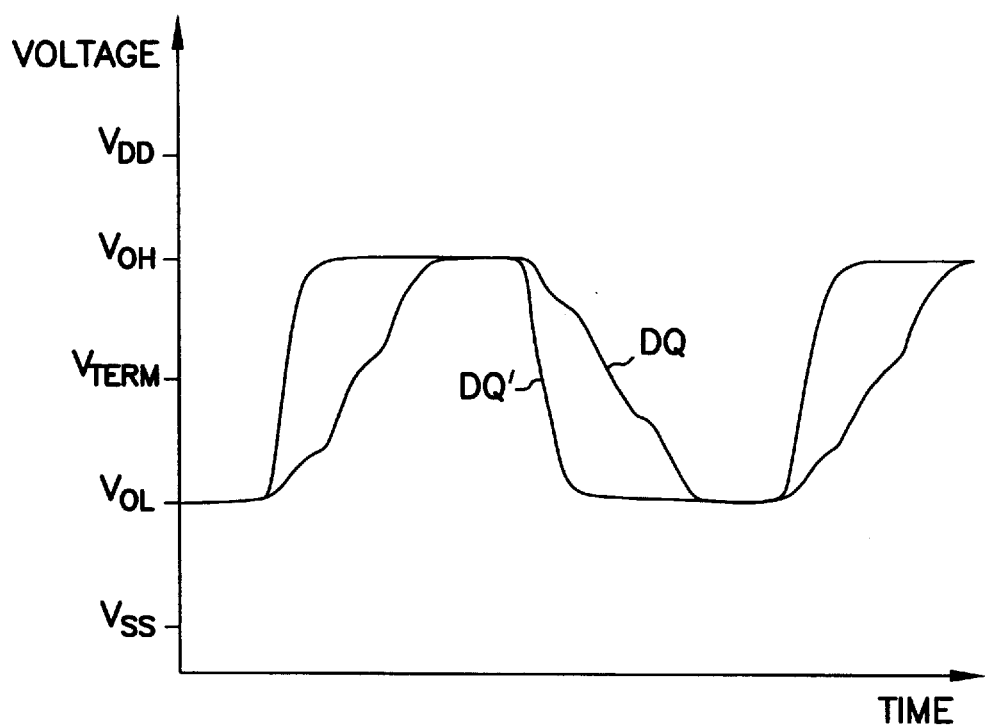
FIG. 7 is a graph illustrating the voltage vs. time waveform of a DQ voltage of the output driver circuit of FIG. 2 and a DQ' voltage of a typical output driver circuit.

FIG. 7 is a graph illustrating the voltage vs. time waveform of the voltage DQ at output node 130 of output driver circuit 100 with respect to a voltage DQ' of a conventional output driver circuit without the slew-rate wave-shaping provided by the present invention. As seen in FIG. 7, the slew rate of voltage transitions of the voltage DQ according to the output driver circuit 100 of the present invention may be controlled more precisely than the voltage transitions of the voltage DQ' according to the conventional output driver circuit.

FIG. 7 illustrates the case wherein each of the output transistors in the first plurality 200 and second plurality 250 are equally weighted; their effective width/length aspect ratios are substantially identical. As seen in FIG. 7, this results in an approximately linear slew rate wave-shaping.

Figure 8:
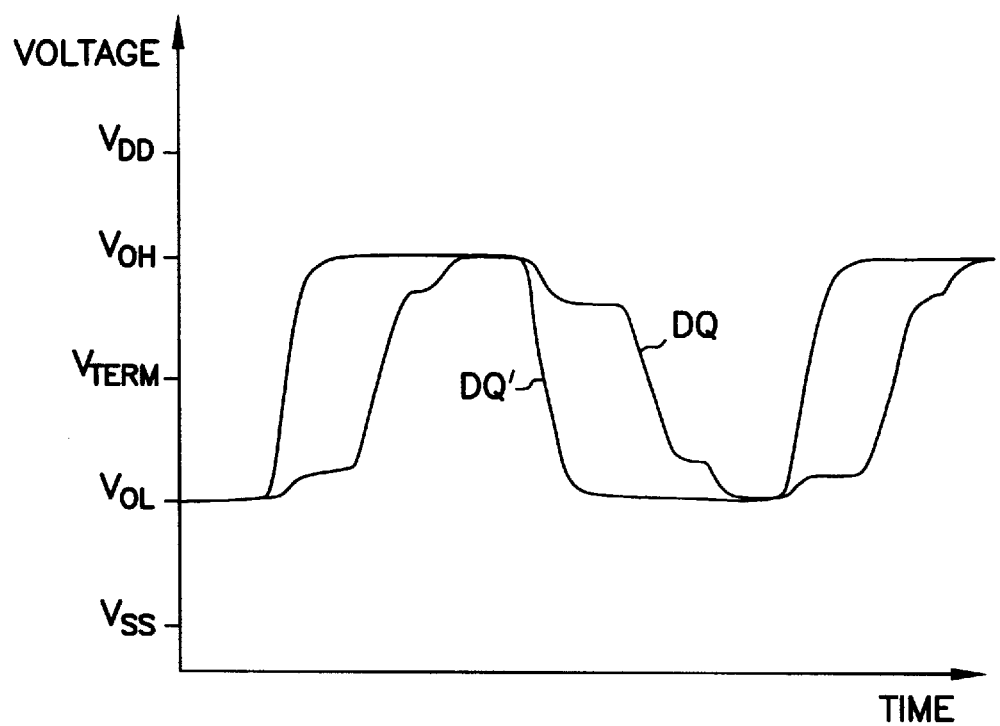
FIG. 8 is a graph of waveforms resulting from a first unequal weighting of the output transistors

FIG. 8 is a graph, similar to FIG. 7, in which the output transistors in the first plurality 200 and second plurality 250 of output transistors are not equally weighted. FIG. 8 illustrates the case where the intermediate transistors, such as 200B and 250B, have effective width/length aspect ratios that are larger than the effective width/length aspect ratios of the end transistors, such as 200A, 200C, 250A, and 250C. In this embodiment, the slew rate of the voltage DQ at output node 130 is faster near the midpoint between the $V_{OH}$ and $V_{OL}$ levels.

Figure 9:
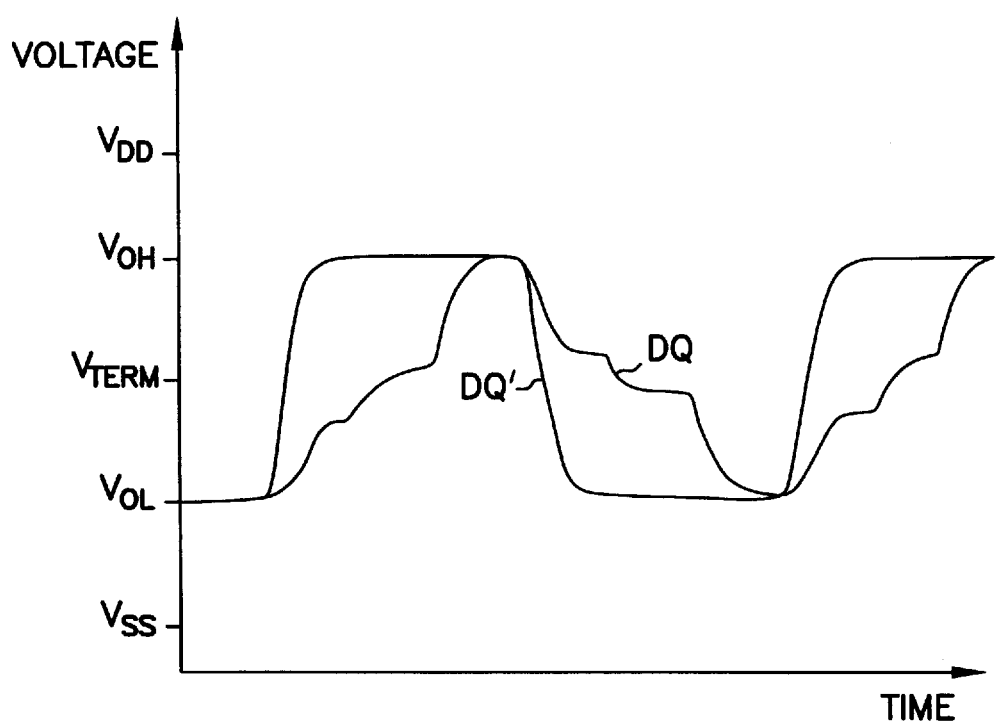
FIG. 9 is a graph of waveforms resulting from a second unequal weighting of the output transistors.

FIG. 9 is a graph, similar to FIG. 7, in which the output transistors in the first plurality 200 and second plurality 250 of output transistors are not equally weighted. FIG. 9 illustrates the case where the intermediate transistors, such as 200B and 250B, have effective width/length aspect ratios that are smaller than the effective width/length aspect ratios of the end transistors, such as 200A, 200C, 250A, and 250C. In this embodiment, the slew rate of the voltage DQ at output node 130 is faster near the each of the $V_{OH}$ and $V_{OL}$ levels than near the midpoint between these two levels.

FIGS. 7–9 illustrate different approaches to weighting output transistors in each of the first plurality 200 and second plurality 250 of output transistors. Ones of the first plurality 200 of output transistors could also be weighted differently from ones of the second plurality 250 of output transistors; many combinations are possible in order to obtain the desired wave-shaping of the voltage DQ at output node 130.

Figure 10:
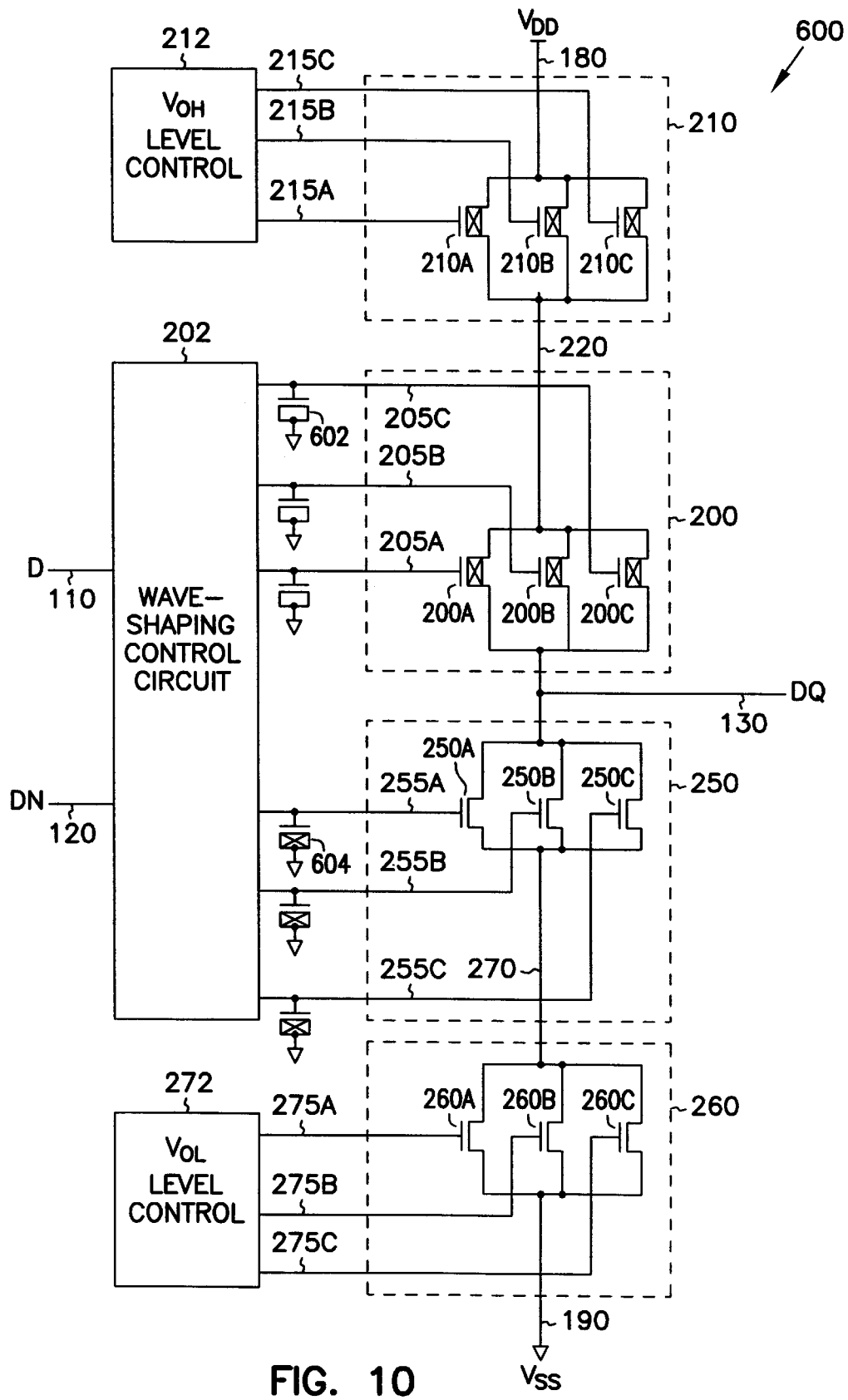
FIG. 10 is a more detailed schematic of another embodiment of the output driver circuit of FIG. 1.

The output driver circuit 100 described above can suffer from rise and fall time imbalance. That is, Nodes 205A–C and nodes 255A–C of FIG. 2 could suffer from finite rise and fall time imbalance because the respective node loads are not equivalent. The load difference is primarily due to nodes 205A–C driving P-type transistors and nodes 255A–C driving N-type transistors. In addition, the size of the N-type and P-type transistors are typically not equivalent. To avoid rise and fall time imbalances, a P-type transistor fabricated as capacitor 604 is coupled between nodes 255A–C and ground, and an N-type transistor fabricated as capacitor 602 is coupled between nodes 205A–C and ground, as illustrated in FIG. 10. The load, therefore, for each stage of the output buffer is matched. Thus, matching circuitry for matching the output load is provided in one embodiment using capacitor connected transistors. Either of the sequence circuits described in FIGS. 4 and 5 can be used in the wave-shaping control circuit 202 of output driver circuit 600. However, an alternate sequence circuit can be used to reduce frequency dependancy, as explained below.

Figure 11:
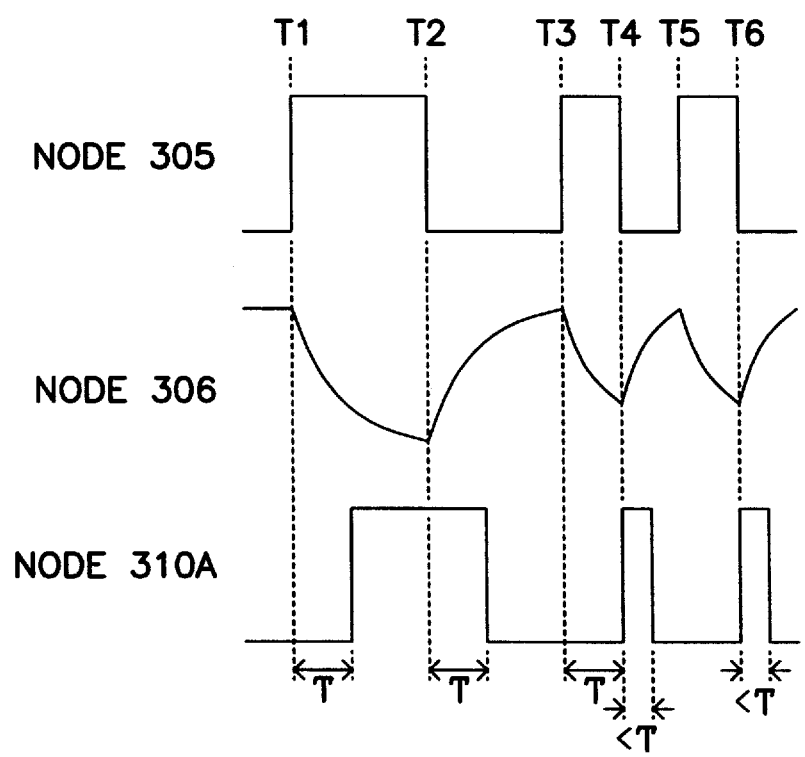
FIG. 11 is a timing diagram of the circuit of FIG. 5.

FIG. 11 illustrates the operation of one delay stage of cascaded inverters 500A and 500B, of FIG. 5. The diagram illustrates the voltage at nodes 305, 306 and 310A. It will be appreciated that as the input signal (node 305) increases in frequency, node 306 does not reach full power rail. Thus, the output signal (node 310A) will have data dependent delays. That is, the rising edge of node 301A is delayed from the rising edge of node 305 by time T, but the delay between the falling edge of node 310A and the falling edge of node 305 will be less than time T at higher frequencies.

Figure 12:
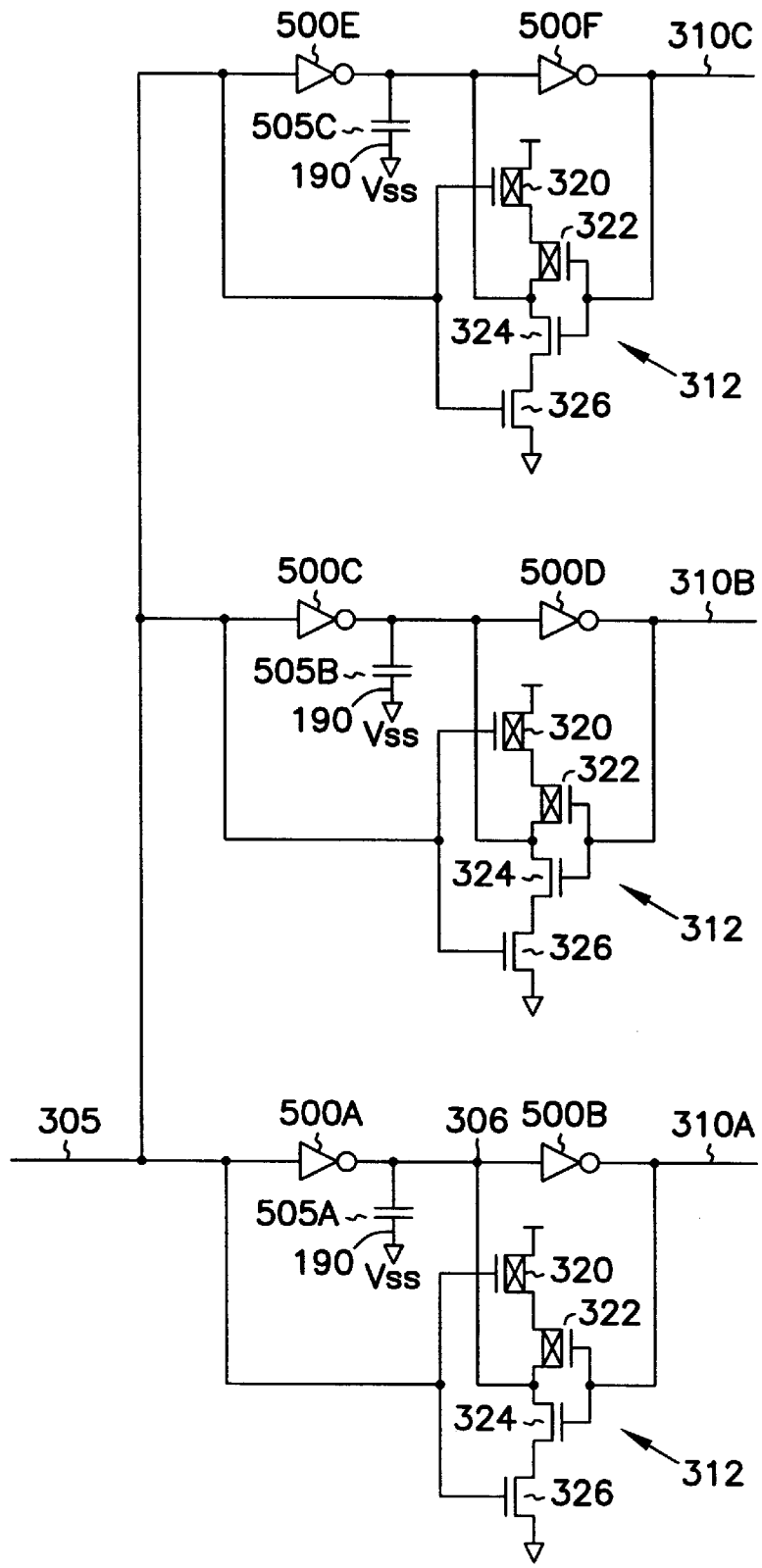
FIG. 12 is a schematic of another embodiment of sequence circuits of FIGS. 3 or 10.
Figure 13:
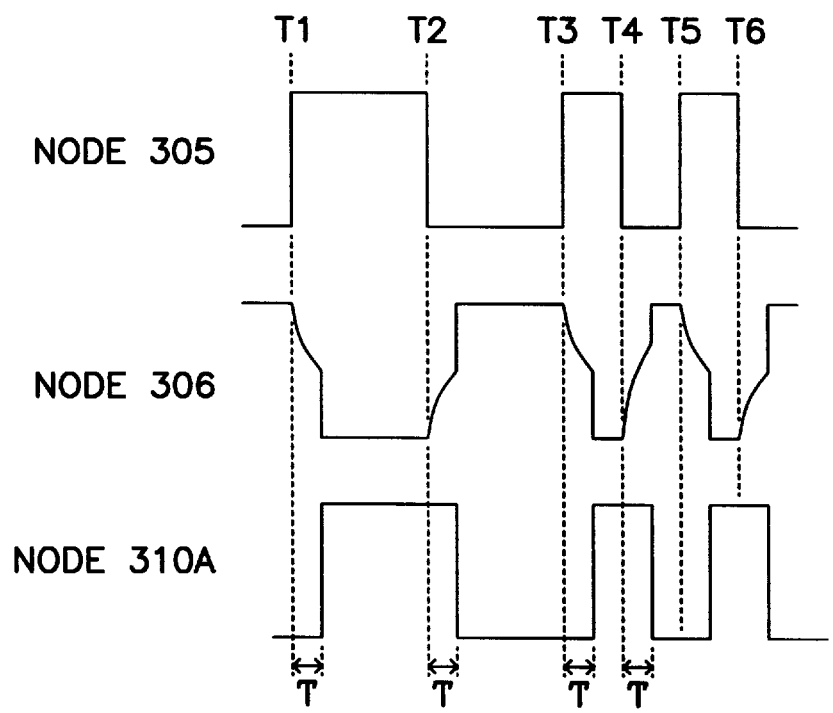
FIG. 13 is a timing diagram of the circuit of FIG. 12.

To reduce the frequency dependance of the delay stage, feed forward and feed back compensation can be added, as shown in FIG. 12. It will be understood that in this embodiment each delay stage of the circuit of FIG. 5 which provide terminal signals 205 and 255 will have forcing circuitry 312. The forcing circuitry comprises P-type transistors 320 and 322, and N-type transistors 324 and 326. In operation, when the input (node 305) and output (node 310A) transition from a high logic state to low logic state, transistors 320 and 322 are activated and pull node 306 to $V_{DD}$. When the input (node 305) and output (node 310A) transition from a low logic state to high logic state, transistors 324 and 326 are activated and pull node 306 to $V_{SS}$. Node 306, therefore, reaches full power rails during each cycle. As shown in FIG. 13, frequency dependance of the time delay between the input and output signals of the delay stage is reduced. As such, the driver circuit can operate over a greater frequency range without degraded performance.

Figure 14:
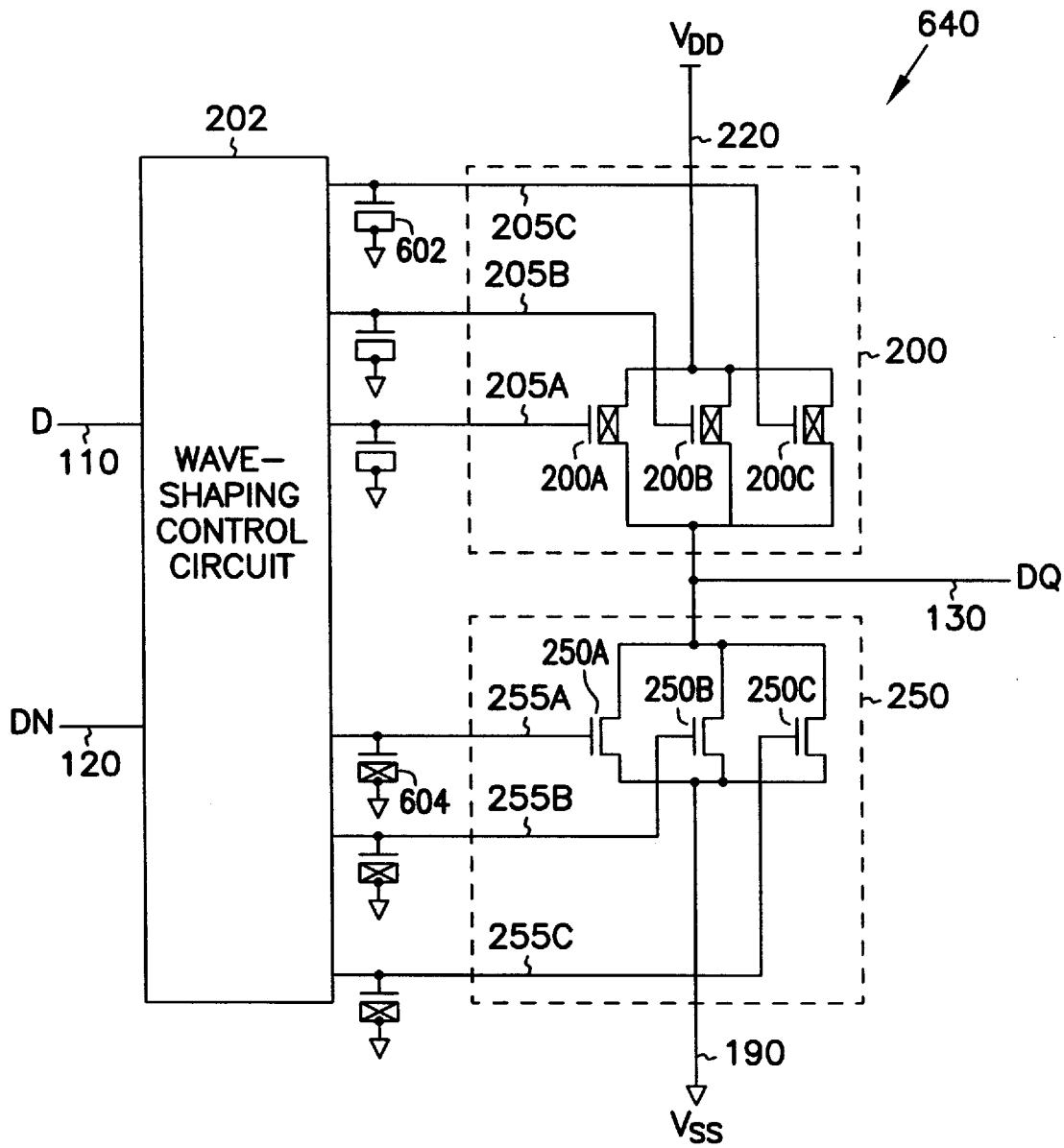
FIG. 14 is a schematic of an alternate embodiment of the output driver circuit.

FIG. 14 is a schematic illustration that illustrates an alternate output driver circuit 640. In FIG. 14, the first and second impedances 210 and 260, respectively, and corresponding $V_{OH}$ and $V_{OL}$ level control circuits 212 and 272 of output driver circuit 600, are not present. This embodiment offers slew rate and other wave-shaping of the transitions in the voltage DQ at output node 130, but does not adjust the $V_{OH}$ and $V_{OL}$ output levels by controlling impedances. N-type capacitors 602 and P-type capacitors 604 are included to balance the load of each stage of the output driver.

Figure 15:
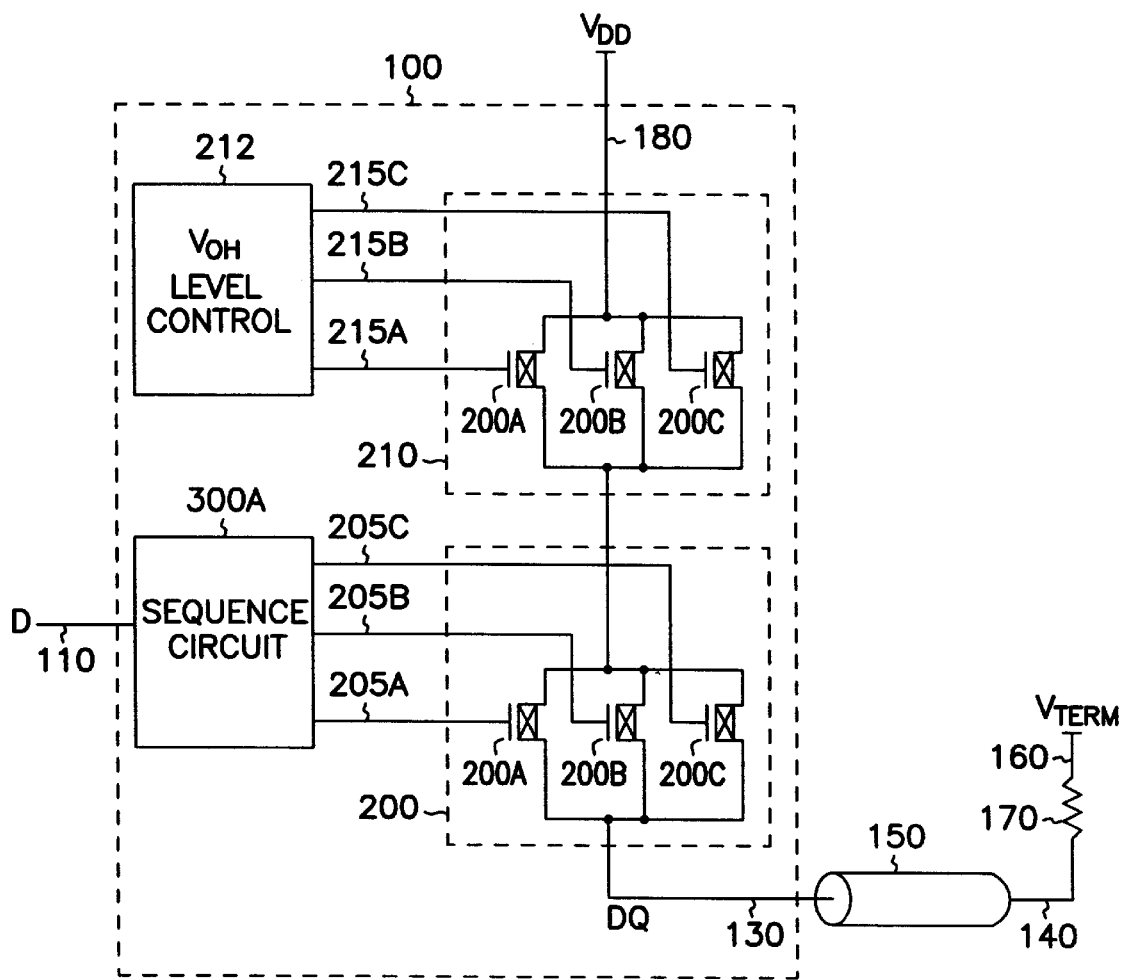
FIG. 15 is a schematic of an alternate embodiment of the output driver circuit.

FIG. 15 is a schematic illustration that illustrates a single-ended alternate embodiment of the output driver circuit 100. In FIG. 15, the second plurality 250 of output transistors and second impedance 260 are not present. This embodiment offers slew rate and $V_{OH}$ level control of the voltage DQ at output node 130; the $V_{OL}$ level is established at $V_{term}$ by the resistive connection through termination resistors 170 to the termination voltage at node 160. Capacitors 602 are not required for this single-ended embodiment.

Figure 16:
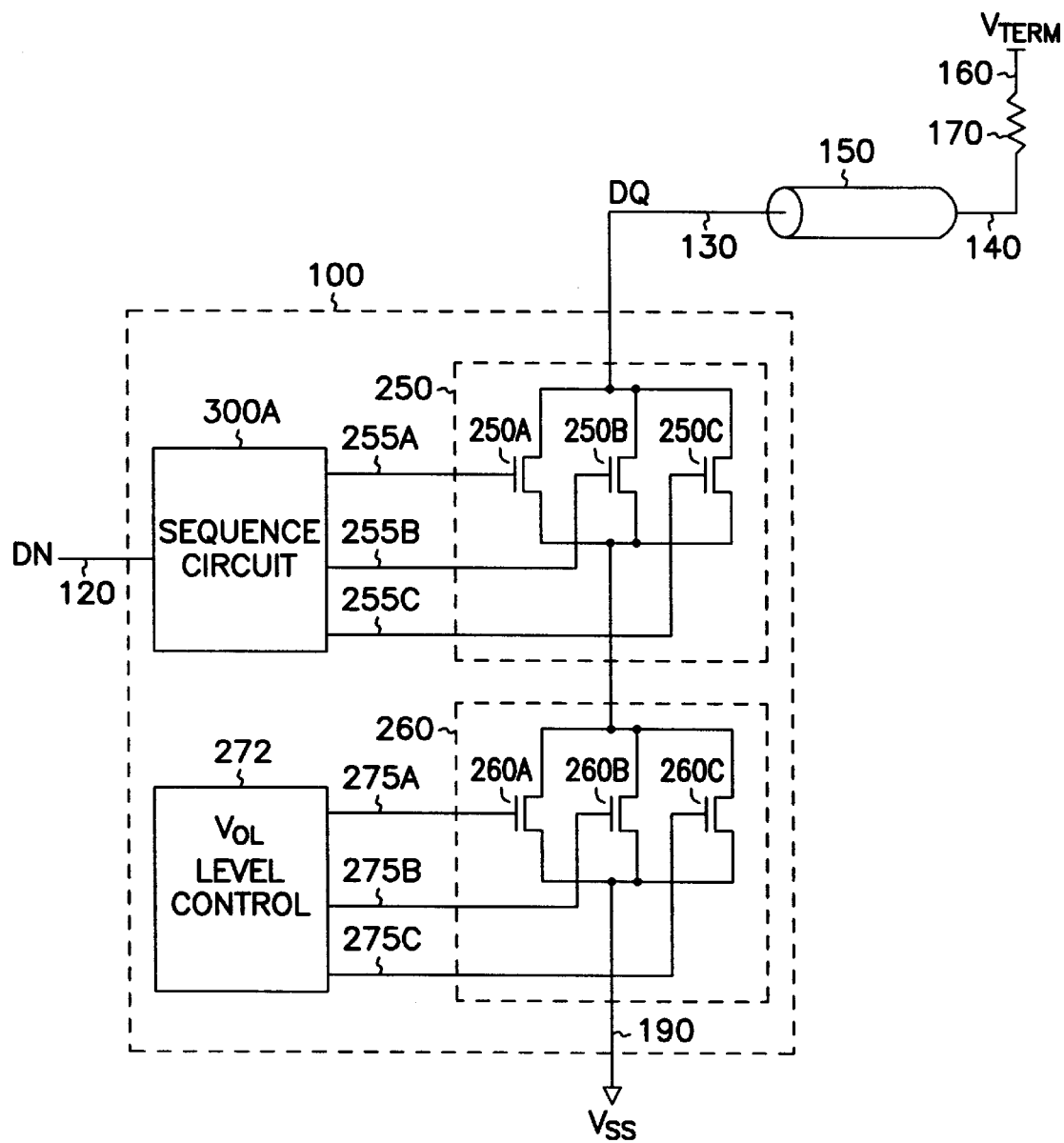
FIG. 16 is a schematic of an alternate embodiment of the output driver circuit.

FIG. 16 is a schematic illustration that illustrates another single-ended alternate embodiment of the output driver circuit 100. In FIG. 12, the first plurality 200 of output transistors and first impedance 210 are not present. This embodiment offers slew rate and $V_{OL}$ level control of the voltage DQ at output node 130; the $V_{OH}$ level is established at $V_{term}$ by the resistive connection through termination resistors 170 to the termination voltage at node 160. Again, because there only a single load, capacitors 604 are not required.

Thus the present invention includes method and apparatus of wave-shaping a signal, including logic voltage levels and a slew rate of a voltage transition therebetween. The present invention is particularly useful for high speed data communications, such as in a synchronous memory including a dynamic random access memory (DRAM).

Although specific embodiments have been illustrated and described herein, it will be appreciated by those of ordinary skill in the art that any arrangement which is calculated to achieve the same purpose may be substituted for the specific embodiment shown. This application is intended to cover any combinations, adaptations, or variations of the present invention. Therefore, it is manifestly intended that this invention be limited only by the claims and the equivalents thereof.

Conclusion

An output driver circuit has been described which offers wave-shaping and logic level adjustment for high speed data communications in a synchronous memory such as a synchronous dynamic random access memory (SDRAM). Level adjustment is obtained by resistive division between a termination resistor and controllable impedances between an output node and $V_{DD}$ and $V_{SS}$ power supplies. Wave-shaping functions include slew rate modification of the signal at the output node, by sequentially turning on or off output transistors in response to a transition in an input signal. Load compensating capacitors have been described for balancing the output loads and eliminating rise and fall time imbalances. Further, delay element stages have been described which include feed forward and feed back circuitry to reduce data dependant delays during high frequency operation.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An output driver circuit comprising:
    a first plurality of output transistors, each having a control terminal, electrically coupling an output node to a first voltage; and
    a control circuit coupled to the control terminal of each output transistor in the first plurality of output transistors for sequentially turning on or off the output transistors in the first plurality of output transistors in response to a transition in a first input signal received by the control circuit;
    the control circuit comprising:
        a first inverter having an output coupled to the control terminal of one of the first plurality of output transistors,
        a second inverter having an output connected to an input of the first inverter,
        a capacitor connected between the output of the second inverter and a reference voltage, and
        forcing circuitry coupled to the first and second inverters to selectively force the output of the second inverter to either the first voltage or second voltage based upon an input of the second inverter and an output of the first inverter.

2. The output driver circuit of claim 1, further comprising a first impedance interposed between the first plurality of output transistors and the first voltage.

3. The output driver circuit of claim 1, further comprising:
    a second plurality of output transistors, electrically coupling the output node to the second voltage; and
    wherein the control circuit is coupled to a control terminal of each output transistor in the second plurality of output transistors for sequentially turning on or off the output transistors in the second plurality of output transistors in response to a transition in a complement of the first input signal received by the control circuit.

4. The output driver circuit of claim 3, further comprising a second impedance interposed between the second plurality of output transistors and the second voltage.

5. The output driver circuit of claim 3 wherein the first plurality of output transistors comprise N-type transistors, and the second plurality of output transistors comprise P-type transistors, further comprising:
    a plurality of P-type capacitors, each of the P-type capacitors connected between the control terminal of one of the first plurality of output transistors and the reference voltage; and
    a plurality of N-type capacitors, each of the N-type capacitors connected between the control terminal of one of the second plurality of output transistors and the reference voltage.

6. An integrated circuit output driver circuit comprising:
a first plurality of first-type output transistors, electrically coupling a first voltage to an output node;
a second plurality of second-type output transistors, electrically coupling the output node to a second voltage;
a control circuit coupled to a control terminal of each output transistor in each of the first and second pluralities of output transistors for sequentially turning on or off the output transistors in the first and second pluralities of output transistors in response to respective transitions in first and second complementary data signals;
a plurality of second-type capacitors, each of the second-type capacitors connected between the control terminal of one of the first plurality of first-type output transistors and a reference voltage; and
a plurality of first-type capacitors, each of the first-type capacitors connected between the control terminal of one of the second plurality of second-type output transistors and the reference voltages;
wherein the control circuit comprises a delay element circuit providing sequencing signals at the control terminals of the output transistors in the first and second plurality of output transistors in response to the first data signal, the delay element circuit comprises:
a first plurality of inverters, each having an output coupled to the control terminal of the output transistors in the first and second plurality of output transistors;
a second plurality of inverters, each having an output connected to an input of one of the first plurality of inverters;
a plurality of capacitors, each connected between the output of one of the second plurality of inverters and a reference voltage; and
forcing circuitry coupled to the first and second pluralities of inverters to selectively force the outputs of the second plurality of inverters to either the first voltage or the second voltage.

7. The integrated circuit output driver of claim 6 wherein the first-type is N-type and the second-type is P-type.

8. The integrated circuit output driver of claim 6, further comprising:
a first impedance, interposed between the first plurality of output transistors and the first voltage; and
a second impedance, interposed between the second plurality of output transistors and the second voltage.

9. The integrated circuit output driver of claim 8, wherein each of the first and second impedances comprises a plurality of transistors providing a controllable impedance.

10. The integrated circuit output driver of claim 9, wherein each of the first and second impedances comprises a plurality of transistors providing a programmably adjustable impedance.

11. The integrated circuit output driver of claim 6, wherein the control circuit comprises an inverter string of series-connected inverters providing sequencing signals at the control terminals of the output transistors in the first plurality of output transistors in response to the first data signal.

12. The integrated circuit output driver of claim 6, wherein the control circuit comprises an inverter string of series-connected inverters providing sequencing signals at the control terminals of the output transistors in the second plurality of output transistors in response to the second data signal.

13. The integrated circuit output driver of claim 6, wherein the delay element circuit provides adjustably delayed sequencing signals.

14. A synchronous memory device comprising:
an array of memory cells for storing data received on a data communication line;
an output driver circuit having an output node electrically coupled to the data communication line, in which the output driver provides data read from the array of memory cells, the output driver circuit comprising:
a first plurality of output transistors, electrically coupling a first voltage to an output node;
a second plurality of output transistors, electrically coupling the output node to a second voltage;
a control circuit coupled to a control terminal of each output transistor in each of the first and second pluralities of output transistors for sequentially turning on or off the output transistors in the first and second pluralities of output transistors in response to respective transitions in first and second complementary data signals; and
matching circuitry, for matching an output load, coupled to the control terminal of each output transistor in each of the first and second pluralities of output transistors;
the control circuit comprising:
a first inverter having an output coupled to the control terminal of one of the first plurality of output transistors,
a second inverter having an output connected to an input of the first inverter,
a capacitor connected between the output of the second inverter and a reference voltage, and
forcing circuitry coupled to the first and second inverters to selectively force the output of the second inverter to either the first voltage or second voltage based upon an input of the second inverter and an output of the first inverter.

15. The synchronous memory device of claim 14 wherein the first plurality of output transistors are fabricated as a first-type transistor, and the second plurality of output transistors are fabricated as a second-type transistor, the matching circuitry comprises:
a first plurality of balance capacitors, each coupled to the control terminal of the first plurality of output transistors, and fabricated as capacitor connected second-type transistors; and
a second plurality of balance capacitors, each coupled to the control terminal of the second plurality of output transistors, and fabricated as capacitor connected first-type transistors.

* * * * *

UNITED STATES PATENT AND TRADEMARK OFFICE
CERTIFICATE OF CORRECTION

PATENT NO. : 5,838,177
DATED : November 17, 1998
INVENTOR(S) : Brent Keeth

It is certified that error appears in the above-identified patent and that said Letters Patent is hereby corrected as shown below:

Column 4, Line 45 reads, "$V_{OH}$" should read -- $V_{OL}$ --

Signed and Sealed this

Eighth Day of May, 2001

Attest:

NICHOLAS P. GODICI

Attesting Officer    Acting Director of the United States Patent and Trademark Office